United States Patent
Ouyang et al.

(10) Patent No.: US 10,157,740 B1
(45) Date of Patent: Dec. 18, 2018

(54) SELECTIVE DEPOSITION PROCESS UTILIZING POLYMER STRUCTURE DEACTIVATION PROCESS

(71) Applicant: Applied Materials, Inc., Santa Clara, CA (US)

(72) Inventors: Christine Y. Ouyang, Santa Clara, CA (US); Ludovic Godet, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 2 days.

(21) Appl. No.: 15/624,648

(22) Filed: Jun. 15, 2017

(51) Int. Cl.
| | | |
|---|---|---|
| H01L 23/495 | (2006.01) | |
| H01L 21/027 | (2006.01) | |
| H01L 21/285 | (2006.01) | |
| H01L 21/02 | (2006.01) | |
| H01L 21/32 | (2006.01) | |
| C23C 16/455 | (2006.01) | |
| B05D 1/00 | (2006.01) | |
| B05D 3/02 | (2006.01) | |

(52) U.S. Cl.
CPC .......... H01L 21/0272 (2013.01); B05D 1/005 (2013.01); B05D 1/60 (2013.01); B05D 3/0254 (2013.01); C23C 16/45525 (2013.01); H01L 21/02118 (2013.01); H01L 21/02271 (2013.01); H01L 21/02282 (2013.01); H01L 21/28562 (2013.01); H01L 21/32 (2013.01)

(58) Field of Classification Search
CPC ........ H01L 21/0272; B05D 1/005; B05D 1/60
USPC ....................................................... 438/677
See application file for complete search history.

(56) References Cited

U.S. PATENT DOCUMENTS

| | | | |
|---|---|---|---|
| 6,413,587 B1 | 7/2002 | Hawker et al. | |
| 2009/0280157 A1* | 11/2009 | Maas | C08F 265/00 424/426 |
| 2012/0034762 A1 | 2/2012 | Bryce et al. | |
| 2015/0170961 A1 | 6/2015 | Romero et al. | |
| 2016/0244581 A1* | 8/2016 | Brink | B05D 3/0453 |

(Continued)

FOREIGN PATENT DOCUMENTS

KR 20150131133 A 11/2015

OTHER PUBLICATIONS

"Preparation of End-Grafted Polymer Brushes by Nitroxide-Mediated Free Radical Polymerization of Vaporized Vinyl Monomers". Li, Jun, et al. Langmuir, vol. 21, No. 21, 2005. p. 9562-9567 Received Apr. 25, 2005. Final Form Jul. 27, 2005.

(Continued)

*Primary Examiner* — David S Blum
(74) *Attorney, Agent, or Firm* — Patterson + Sheridan, LLP (57) ABSTRACT

Methods for depositing desired materials formed on different locations of a substrate with different materials using a selective deposition process for semiconductor applications are provided. In one embodiment, a method of forming a structure with desired materials on a substrate includes disposing organic materials on a surface of a substrate, performing a thermal treatment process to form polymer brush materials from the organic materials selective on a first region of the substrate, and selectively forming a material layer on a second region of the substrate uncovered by the polymer brush materials.

15 Claims, 6 Drawing Sheets

(56) References Cited

U.S. PATENT DOCUMENTS

2017/0053797 A1    2/2017  Nemani et al.
2017/0194196 A1*   7/2017  Brink ................ H01L 21/76807

OTHER PUBLICATIONS

"Formation and Aqueos Surface Wettability of Polysiloxane Nanofibers Prepared via Surface Initiated, Vapor-Phase Polymerization of Organtrichlorosilanes". Rollings, De-ann E., et al. Langmuir, vol. 23, No. 10, 2007, p. 5275-5278.
International Seach Report and Written Opinion from PCT/US2018/031019 dated Sep. 11, 2018.

* cited by examiner

SELECTIVE DEPOSITION PROCESS UTILIZING POLYMER STRUCTURE DEACTIVATION PROCESS

BACKGROUND

Field

Embodiments generally relate to methods for selectively forming desired materials on certain locations of a semiconductor substrate. More specifically, embodiments relate to methods for selectively forming desired materials on a substrate with different materials at different locations of the substrate by a selective deposition process utilizing polymer brush structures.

Description of the Related Art

Reliably producing sub-half micron and smaller features is one of the key technology challenges for next generation very large scale integration (VLSI) and ultra large-scale integration (ULSI) of semiconductor devices. However, as the limits of circuit technology are pushed, the shrinking dimensions of VLSI and ULSI technology have placed additional demands on processing capabilities. Reliable formation of gate structures on the substrate is important to VLSI and ULSI success and to the continued effort to increase circuit density and quality of individual substrates and die.

As the geometry limits of the structures used to form semiconductor devices are pushed against technology limits, the need for accurate formation with desired materials for the manufacture of structures having small critical dimensions and high aspect ratios and structures with different materials has become increasingly difficult to satisfy. A conventional method for selective deposition may be performed to locally form a material layer on only certain locations of a planer surface on a substrate made from a material different than the substrate material. However, as the geometry limits of the structures continue to push, the selective deposition process may not be efficiently confined and formed at the designated small dimensions on the substrate, resulting in undesired materials formed on the undesired locations of the substrate. Thus, the materials would be globally formed on the entire surface of such substrate without selectivity, thus making the selective material deposition difficult to achieve.

Thus, there is a need for improved methods for a selective deposition process suitable for advanced generation of semiconductor chips or other semiconductor devices.

SUMMARY

Methods for depositing desired materials formed on different locations of a substrate with different materials utilizing polymer brush structures for semiconductor applications are provided. In one embodiment, a method of forming a structure with desired materials on a substrate includes disposing organic materials on a surface of a substrate, performing a thermal treatment process to form polymer brush materials from the organic materials selective on a first region of the substrate, and selectively forming a material layer on a second region of the substrate uncovered by the polymer brush materials.

In another embodiment, a method of forming a structure with desired materials on a substrate for semiconductor applications includes selectively disposing an initiator on a first region of a substrate, vapor polymerizing the initiator to form polymer brush structures on the first region of the substrate, and selectively forming a material layer on a second region of the substrate uncovered by the polymer brush structures.

In yet another embodiment, a method of forming a structure with desired materials on a substrate for semiconductor applications includes spin-coating a polymer material globally on a substrate, thermal treating the polymer material selectively disposed on a first region of the substrate to form a treated polymer material on the first region of the substrate, removing the polymer material disposed on a second region of the substrate untreated by the thermal treating process, and selectively forming a material layer on the second region of the substrate uncovered by the treated polymer material.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this disclosure and are therefore not to be considered limiting of its scope, for the disclosure may admit to other equally effective embodiments.

DETAILED DESCRIPTION

Methods for selectively depositing different materials at different locations on a structure formed on the substrate are provided. The structure may include a back-end structure, front-end structure, interconnection structure, passivation structure, fin structure, a gate structure, a contact structure, or any suitable structure in semiconductor devices. In one example, a selective deposition process may be utilized to form different materials on different surfaces, e.g., different portions of a structure formed on a substrate by utilizing polymer brush structures formed selectively on certain locations of the substrate. Different types of the polymer brush structures may also be utilized to form polymer brush structures on the substrate with different material properties. The polymer brush structures may selectively be formed and confined in a first predetermined region of the substrate. Subsequently, a selective deposition process may be performed to form a target material layer selectively on a second predetermined region of the substrate uncovered by the polymer brush structures. The materials selected to form the polymer brush structures on the substrate enables the following selective deposition process to allow the target material layer to be selectively formed on the second predetermined region uncovered by the polymer brush structures, rather than on the polymer brush structures.

Figure 1:
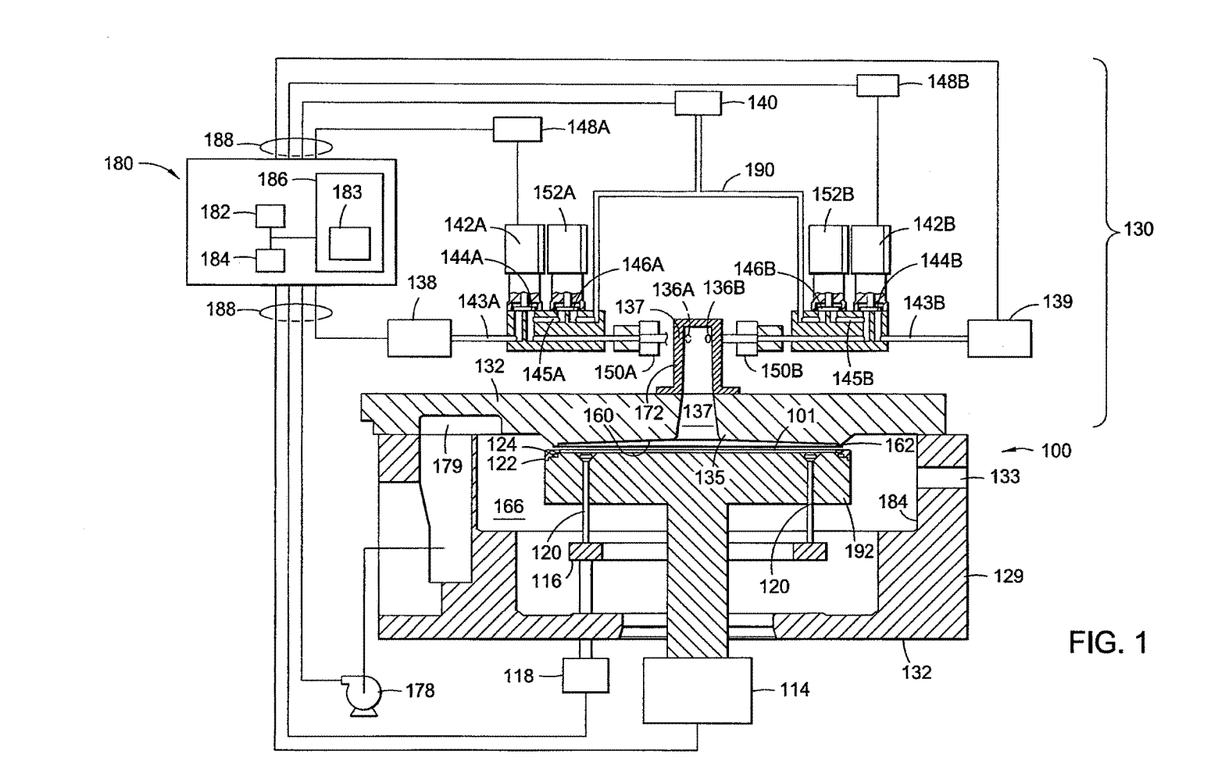
FIG. 1 depict an apparatus that may be utilized to perform an atomic layer deposition (ALD) process.

FIG. 1 is a schematic cross-sectional view of one embodiment of an atomic layer deposition (ALD) processing chamber 100. The ALD processing chamber 100 includes a gas delivery apparatus 130 adapted for cyclic deposition, such as ALD or chemical vapor deposition (CVD). The terms ALD and CVD as used herein refer to the sequential introduction of reactants to deposit a thin layer over a substrate structure. The sequential introduction of reactants may be repeated to deposit a plurality of thin layers to form a conformal layer to a desired thickness. The chamber 100 may also be adapted for other deposition techniques along with lithography process.

The chamber 100 comprises a chamber body 129 having a bottom 132. A slit valve tunnel 133 formed through the chamber body 129 provides access for a robot (not shown) to deliver and retrieve a substrate 101, such as a 200 mm, 300 mm or 450 mm semiconductor substrate or a glass substrate, from the chamber 100.

A substrate support 192 is disposed in the chamber 100 and supports the substrate 101 during processing. The substrate support 192 is mounted to a lift 114 to raise and lower the substrate support 192 and the substrate 338 disposed thereon. A lift plate 116 is connected to a lift plate actuator 118 that controls the elevation of the lift plate 116. The lift plate 116 may be raised and lowered to raise and lower pins 120 movably disposed through the substrate support 192. The pins 120 are utilized to raise and lower the substrate 101 over the surface of the substrate support 192. The substrate support 192 may include a vacuum chuck, an electrostatic chuck, or a clamp ring for securing the substrate 101 to the surface of the substrate support 192 during processing.

The substrate support 192 may be heated to heat the substrate 101 disposed thereon. For example, the substrate support 192 may be heated using an embedded heating element, such as a resistive heater, or may be heated using radiant heat, such as heating lamps disposed above the substrate support 192. A purge ring 122 may be disposed on the substrate support 192 to define a purge channel 124 which provides a purge gas to a peripheral portion of the substrate 101 to prevent deposition thereon.

A gas delivery apparatus 130 is disposed at an upper portion of the chamber body 129 to provide a gas, such as a process gas and/or a purge gas, to the chamber 100. A pumping system 178 is in communication with a pumping channel 179 to evacuate any desired gases from the chamber 100 and to help maintain a desired pressure or a desired pressure range inside a pumping zone 166 of the chamber 100.

In one embodiment, the gas delivery apparatus 130 comprises a chamber lid 132. The chamber lid 132 includes an expanding channel 137 extending from a central portion of the chamber lid 132 and a bottom surface 160 extending from the expanding channel 137 to a peripheral portion of the chamber lid 132. The bottom surface 160 is sized and shaped to substantially cover the substrate 101 disposed on the substrate support 192. The chamber lid 132 may have a choke 162 at a peripheral portion of the chamber lid 132 adjacent the periphery of the substrate 101. The cap portion 172 includes a portion of the expanding channel 137 and gas inlets 136A, 136B. The expanding channel 137 has gas inlets 136A, 136B to provide gas flows from two similar valves 142A, 142B. The gas flows from the valves 142A, 142B may be provided together and/or separately.

In one configuration, valve 142A and valve 142B are coupled to separate reactant gas sources, but are coupled to the same purge gas source. For example, valve 142A is coupled to a reactant gas source 138 and valve 142B is coupled to reactant gas source 139, which both valves 142A, 142B are coupled to purge a gas source 140. Each valve 142A, 142B includes a delivery line 143A, 143B having a valve seat assembly 144A, 144B and includes a purge line 145A, 145B having a valve seat assembly 146A, 146B. The delivery line 143A, 143B is in communication with the reactant gas source 138, 139 and is in communication with the gas inlet 137A, 137B of the expanding channel 190. The valve seat assembly 144A, 144B of the delivery line 143A, 143B controls the flow of the reactant gas from the reactant gas source 138, 139 to the expanding channel 190. The purge line 145A, 145B is in communication with the purge gas source 140 and intersects the delivery line 143A, 143B downstream of the valve seat assembly 144A, 144B of the delivery line 143A, 143B. The valve seat assembly 146A, 146B of the purge line 145A, 145B controls the flow of the purge gas from the purge gas source 140 to the delivery line 143A, 143B. If a carrier gas is used to deliver reactant gases from the reactant gas source 638, 639, the same gas may be used as a carrier gas and a purge gas (i.e., an argon gas may be used as both a carrier gas and a purge gas).

Each valve 142A, 142B may be a zero dead volume valve to enable flushing of a reactant gas from the delivery line 143A, 143B when the valve seat assembly 144A, 144B of the valve is closed. For example, the purge line 145A, 145B may be positioned adjacent the valve seat assembly 144A, 144B of the delivery line 143A, 143B. When the valve seat assembly 144A, 144B is closed, the purge line 145A, 145B may provide a purge gas to flush the delivery line 143A, 143B. In the embodiment shown, the purge line 145A, 145B is positioned as slightly spaced from the valve seat assembly 144A, 144B of the delivery line 143A, 143B so that a purge gas is not directly delivered into the valve seat assembly 144A, 144B when open. A zero dead volume valve as used herein is defined as a valve which has negligible dead volume (i.e., not necessary zero dead volume.) Each valve 142A, 142B may be adapted to provide a combined gas flow and/or separate gas flow of the reactant gas from the sources 138, 139 and the purge gas from the source 140. The pulses of the purge gas may be provided by opening and closing a diaphragm of the valve seat assembly 146A of the purge line 145A. The pulses of the reactant gas from the reactant gas source 138 may be provided by opening and closing the valve seat assembly 144A of the delivery line 143A.

A control unit 180 may be coupled to the chamber 100 to control processing conditions. The control unit 180 comprises a central processing unit (CPU) 182, support circuitry 184, and memory 186 containing associated control software 183. The control unit 180 may be one of any form of general purpose computer processors that can be used in an industrial setting for controlling various chambers and subprocessors. The CPU 182 may use any suitable memory 186, such as random access memory, read only memory, floppy disk drive, compact disc drive, hard disk, or any other form of digital storage, local or remote. Various support circuits may be coupled to the CPU 182 for supporting the chamber 100. The control unit 180 may be coupled to another controller that is located adjacent individual chamber components, such as the programmable logic controllers 610148A, 648B of the valves 142A, 142B. Bi-directional communications between the control unit 180 and various other components of the chamber 100 are handled through numerous signal cables collectively referred to as signal buses 188, some of which are illustrated in FIG. 1. In addition to the control of process gases and purge gases from gas sources 138, 139, 140 and from the programmable logic controllers 148A, 148B of the valves 142A, 142B, the control unit 180 may be configured to be responsible for automated control of other activities used in substrate processing, such as substrate transport, temperature control, chamber evacuation, among other activities, some of which are described elsewhere herein.

Figure 2:
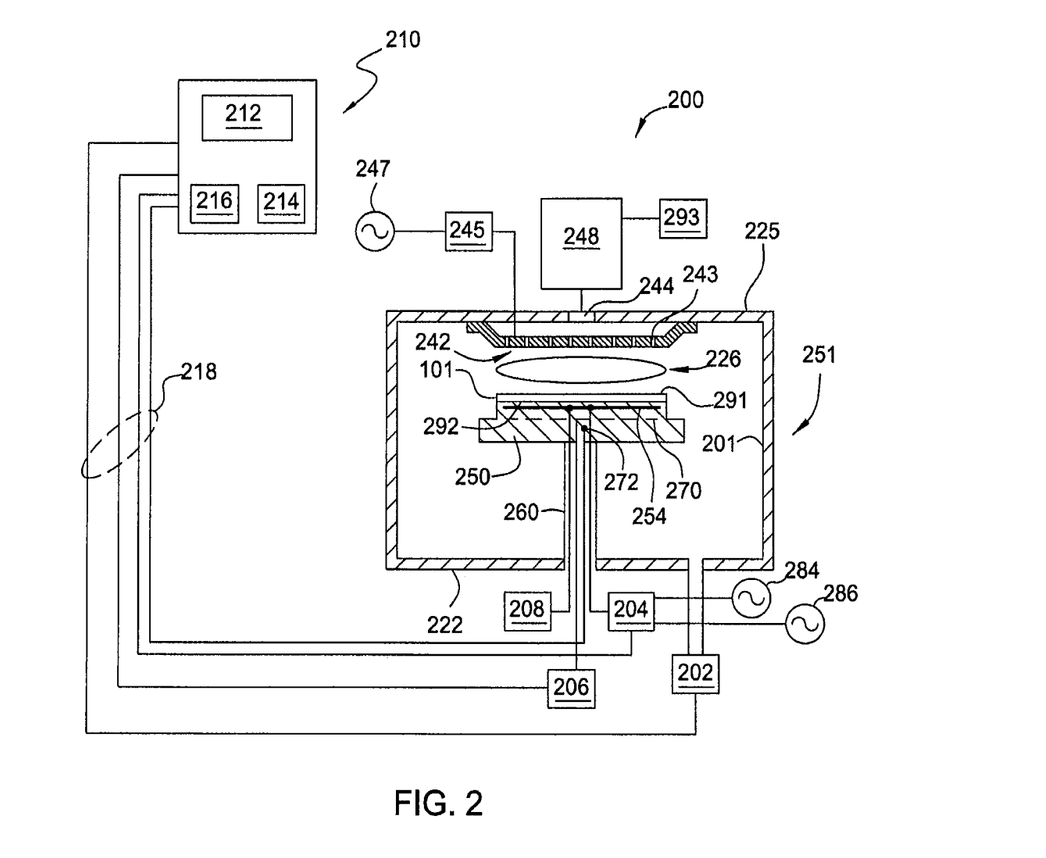
FIG. 2 depicts an apparatus utilized to form polymer brush structures on a substrate in accordance with one embodiment of the present disclosure.

FIG. 2 is a cross sectional view of a plasma processing chamber 200 suitable for performing a plasma deposition process (e.g., a plasma enhanced CVD or a metal organic CVD) that may be utilized as semiconductor interconnection structures for semiconductor devices manufacture. The processing chamber 200 may be a suitably adapted CENTURA®, PRODUCER® SE or PRODUCER® GT or PRODUCER® XP processing system available from Applied Materials, Inc., of Santa Clara, Calif. It is contemplated that other processing systems, including those produced by other manufacturers, may benefit from embodiments described herein.

The processing chamber 200 includes a chamber body 251. The chamber body 251 includes a lid 225, a sidewall 201 and a bottom wall 222 that define an interior volume 226.

A substrate support pedestal 250 is provided in the interior volume 126 of the chamber body 251. The pedestal 250 may be fabricated from aluminum, ceramic, aluminum nitride, and other suitable materials. In one embodiment, the pedestal 250 is fabricated by a ceramic material, such as aluminum nitride, which is a material suitable for use in a high temperature environment, such as a plasma process environment, without causing thermal damage to the pedestal 250. The pedestal 250 may be moved in a vertical direction inside the chamber body 251 using a lift mechanism (not shown).

The pedestal 250 may include an embedded heater element 270 suitable for controlling the temperature of a substrate 101 supported on the pedestal 250. In one embodiment, the pedestal 250 may be resistively heated by applying an electric current from a power supply 206 to the heater element 270. In one embodiment, the heater element 270 may be made of a nickel-chromium wire encapsulated in a nickel-iron-chromium alloy (e.g., INCOLOY®) sheath tube. The electric current supplied from the power supply 206 is regulated by the controller 210 to control the heat generated by the heater element 270, thus maintaining the substrate 101 and the pedestal 250 at a substantially constant temperature during film deposition at any suitable temperature range. In another embodiment, the pedestal may be maintained at room temperature as needed. In yet another embodiment, the pedestal 250 may also include a chiller (not shown) as needed to cool the pedestal 250 at a range lower than room temperature as needed. The supplied electric current may be adjusted to selectively control the temperature of the pedestal 250 between about 20 degrees Celsius to about 700 degrees Celsius.

A temperature sensor 272, such as a thermocouple, may be embedded in the substrate support pedestal 250 to monitor the temperature of the pedestal 250 in a conventional manner. The measured temperature is used by the controller 210 to control the power supplied to the heater element 270 to maintain the substrate at a desired temperature.

The pedestal 250 generally includes a plurality of lift pins (not shown) disposed therethrough that are configured to lift the substrate 101 from the pedestal 250 and facilitate exchange of the substrate 101 with a robot (not shown) in a conventional manner.

The pedestal 250 comprises at least one electrode 292 for retaining the substrate 101 on the pedestal 250. The electrode 292 is driven by a chucking power source 208 to develop an electrostatic force that holds the substrate 101 to the pedestal surface, as is conventionally known. Alternatively, the substrate 101 may be retained to the pedestal 250 by clamping, vacuum or gravity.

In one embodiment, the pedestal 250 is configured as a cathode having the electrode 292 embedded therein coupled to at least one RF bias power source, shown in FIG. 2 as two RF bias power sources 284, 286. Although the example depicted in FIG. 2 shows two RF bias power sources, 284, 286, it is noted that the number of the RF bias power sources may be any number as needed. The RF bias power sources 284, 286 are coupled between the electrode 292 disposed in the pedestal 250 and another electrode, such as a gas distribution plate 242 or lid 225 of the processing chamber 200. The RF bias power source 284, 286 excites and sustains a plasma discharge formed from the gases disposed in the processing region of the processing chamber 200.

In the embodiment depicted in FIG. 2, the dual RF bias power sources 284, 286 are coupled to the electrode 292 disposed in the pedestal 250 through a matching circuit 204. The signal generated by the RF bias power source 284, 286 is delivered through matching circuit 204 to the pedestal 250 through a single feed to ionize the gas mixture provided in the plasma processing chamber 200, thereby providing ion energy necessary for performing a deposition or other plasma enhanced process. The RF bias power sources 284, 286 are generally capable of producing an RF signal having a frequency of from about 50 kHz to about 200 MHz and a power between about 0 Watts and about 5000 Watts.

It is noted that in one example depicted herein, the plasma is only turned on when a cleaning process is performed in the processing chamber 200 as needed.

A vacuum pump 202 is coupled to a port formed in the bottom 222 of the chamber body 251. The vacuum pump 202 is used to maintain a desired gas pressure in the chamber body 251. The vacuum pump 202 also evacuates post-processing gases and by-products of the process from the chamber body 251.

The processing chamber 200 includes one or more gas delivery passages 244 coupled through the lid 225 of the processing chamber 200. The gas delivery passages 244 and the vacuum pump 202 are positioned at opposite ends of the processing chamber 200 to induce laminar flow within the interior volume 226 to minimize particulate contamination.

The gas delivery passage 244 is coupled to the gas panel 293 through a remote plasma source (RPS) 248 to provide a gas mixture into the interior volume 226. In one embodiment, the gas mixture supplied through the gas delivery passage 244 may be further delivered through a gas distribution plate 242 disposed below the gas delivery passage 244. In one example, the gas distribution plate 242 having a plurality of apertures 243 is coupled to the lid 225 of the chamber body 251 above the pedestal 250. The apertures 243 of the gas distribution plate 242 are utilized to introduce process gases from the gas panel 293 into the chamber body 251. The apertures 243 may have different sizes, number, distributions, shape, design, and diameters to facilitate the flow of the various process gases for different process requirements. A plasma is formed from the process gas mixture exiting the gas distribution plate 242 to enhance thermal decomposition of the process gases resulting in the deposition of material on the surface 291 of the substrate 101.

The gas distribution plate 242 and substrate support pedestal 250 may be formed a pair of spaced apart electrodes in the interior volume 226. One or more RF sources 247 provide a bias potential through a matching network 245 to the gas distribution plate 242 to facilitate generation of a plasma between the gas distribution plate 242 and the pedestal 250. Alternatively, the RF sources 247 and matching network 245 may be coupled to the gas distribution plate 242, substrate support pedestal 250, or coupled to both the gas distribution plate 242 and the substrate support pedestal 250, or coupled to an antenna (not shown) disposed exterior to the chamber body 251. In one embodiment, the RF sources 247 may provide between about 10 Watts and about 3000 Watts at a frequency of about 30 kHz to about 13.6 MHz. Alternatively, the RF source 247 may be a microwave generator that provide microwave power to the gas distribution plate 242 that assists generation of the plasma in the interior volume 226.

In one embodiment, the remote plasma source (RPS) 248 may be alternatively coupled to the gas delivery passages 244 to assist in forming a plasma from the gases supplied from the gas panel 293 into the in the interior volume 226. The remote plasma source 248 provides plasma formed from the gas mixture provided by the gas panel 293 to the processing chamber 200.

The controller 210 includes a central processing unit (CPU) 212, a memory 216, and a support circuit 214 utilized to control the process sequence and regulate the gas flows from the gas panel 293. The CPU 212 may be of any form of a general purpose computer processor that may be used in an industrial setting. The software routines can be stored in the memory 216, such as random access memory, read only memory, floppy, or hard disk drive, or other form of digital storage. The support circuit 214 is conventionally coupled to the CPU 212 and may include cache, clock circuits, input/output systems, power supplies, and the like. Bi-directional communications between the controller 210 and the various components of the processing chamber 200 are handled through numerous signal cables collectively referred to as signal buses 218, some of which are illustrated in FIG. 2.

Figure 3:
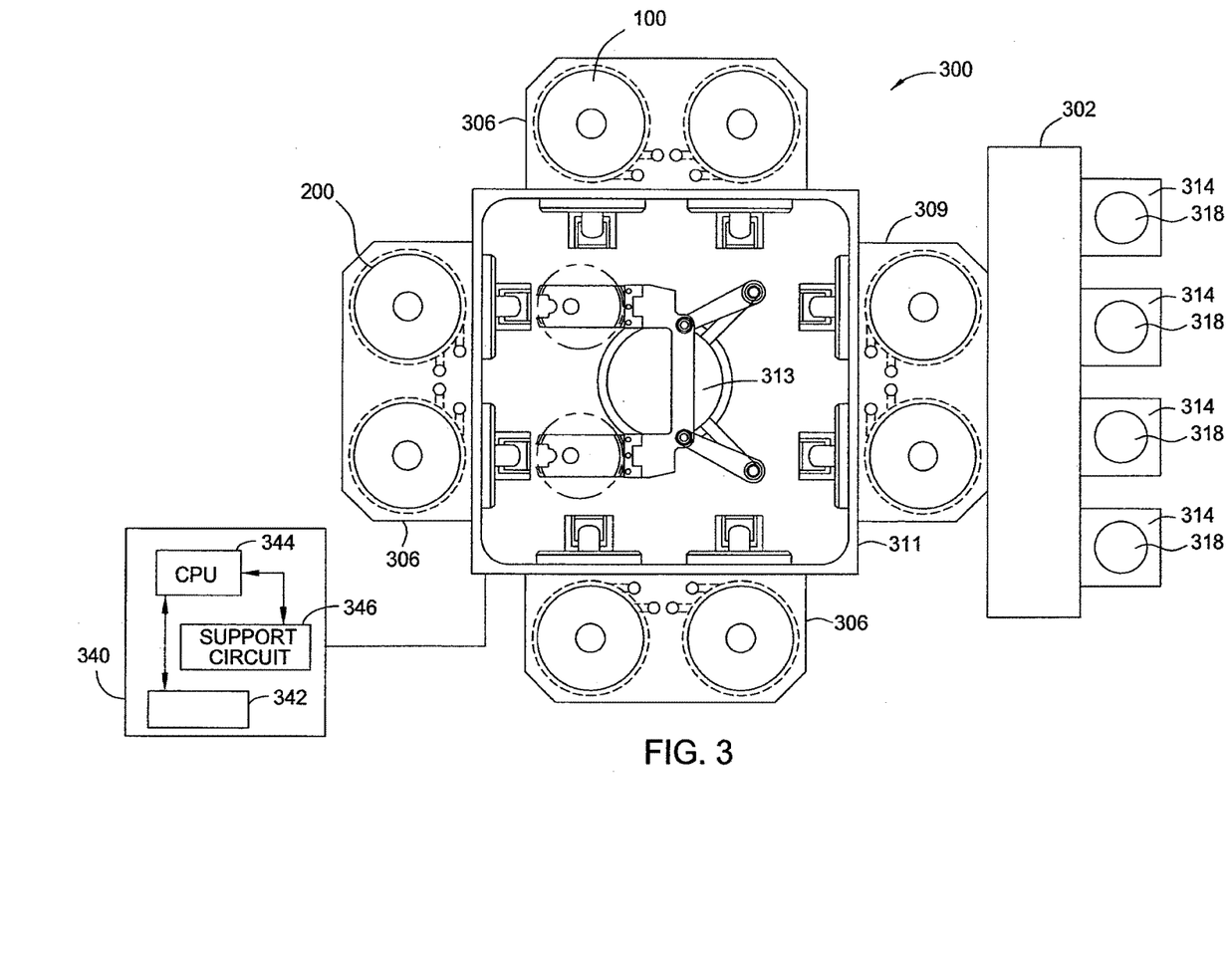
FIG. 3 depicts a schematic view of a cluster processing system that includes the apparatus of FIGS. 1 and 2.

FIG. 3 depicts a plan view of a semiconductor processing system 300 that the methods described herein may be practiced. One processing system that may be adapted to benefit from the disclosure is a 300 mm or 450 mm PRODUCER® processing system, commercially available from Applied Materials, Inc., of Santa Clara, Calif. The processing system 300 generally includes a front platform 302 where substrate cassettes 318 included in FOUPs 314 are supported and substrates are loaded into and unloaded from a loadlock chamber 309, a transfer chamber 311 housing a substrate handler 313 and a series of tandem processing chambers 306 mounted on the transfer chamber 311.

Each of the tandem processing chambers 306 includes two process regions for processing the substrates. The two process regions share a common supply of gases, common pressure control, and common process gas exhaust/pumping system. Modular design of the system enables rapid conversion from one configuration to any other. The arrangement and combination of chambers may be altered for purposes of performing specific process steps. Any of the tandem processing chambers 306 can include a lid according to aspects of the disclosure as described below that includes one or more chamber configurations described above with referenced to the processing chamber 100, 200 depicted in FIG. 1 and/or FIG. 2. It is noted that the processing system 300 may be configured to perform a deposition process, etching process, curing processes, or heating/annealing process as needed. In one embodiment, the processing chambers 100, 200, shown as a single chamber designed in FIGS. 1 and 2, may be incorporated into the semiconductor processing system 300.

In one implementation, the processing system 300 can be adapted with one or more of the tandem processing chambers having supporting chamber hardware known to accommodate various other known processes such as chemical vapor deposition (CVD), physical vapor deposition (PVD), atomic layer deposition (ALD), spin coating, etching, curing, or heating/annealing and the like. For example, the system 300 can be configured with one of the processing chambers 200 in FIG. 2 as a plasma deposition chamber for deposition, such as a metal containing film or polymer brush structures, or one of the processing chambers 100 depicted in FIG. 1 as an atomic layer deposition processing chamber for forming metal containing dielectric layers, metal layers or insulating materials formed on the substrates. Such a configuration can enhance research and development fabrication utilization and, if desired, substantially eliminate exposure of films as etched to atmosphere.

A controller 340, including a central processing unit (CPU) 344, a memory 342, and support circuits 346, is coupled to the various components of the semiconductor processing system 300 to facilitate control of the processes of the present disclosure. The memory 342 can be any computer-readable medium, such as random access memory (RAM), read only memory (ROM), floppy disk, hard disk, or any other form of digital storage, local or remote to the semiconductor processing system 300 or CPU 344. The support circuits 446 are coupled to the CPU 344 for supporting the CPU in a conventional manner. These circuits include cache, power supplies, clock circuits, input/output circuitry and subsystems, and the like. A software routine or a series of program instructions stored in the memory 342, when executed by the CPU 344, executes the tandem processing chambers 306.

Figure 4:
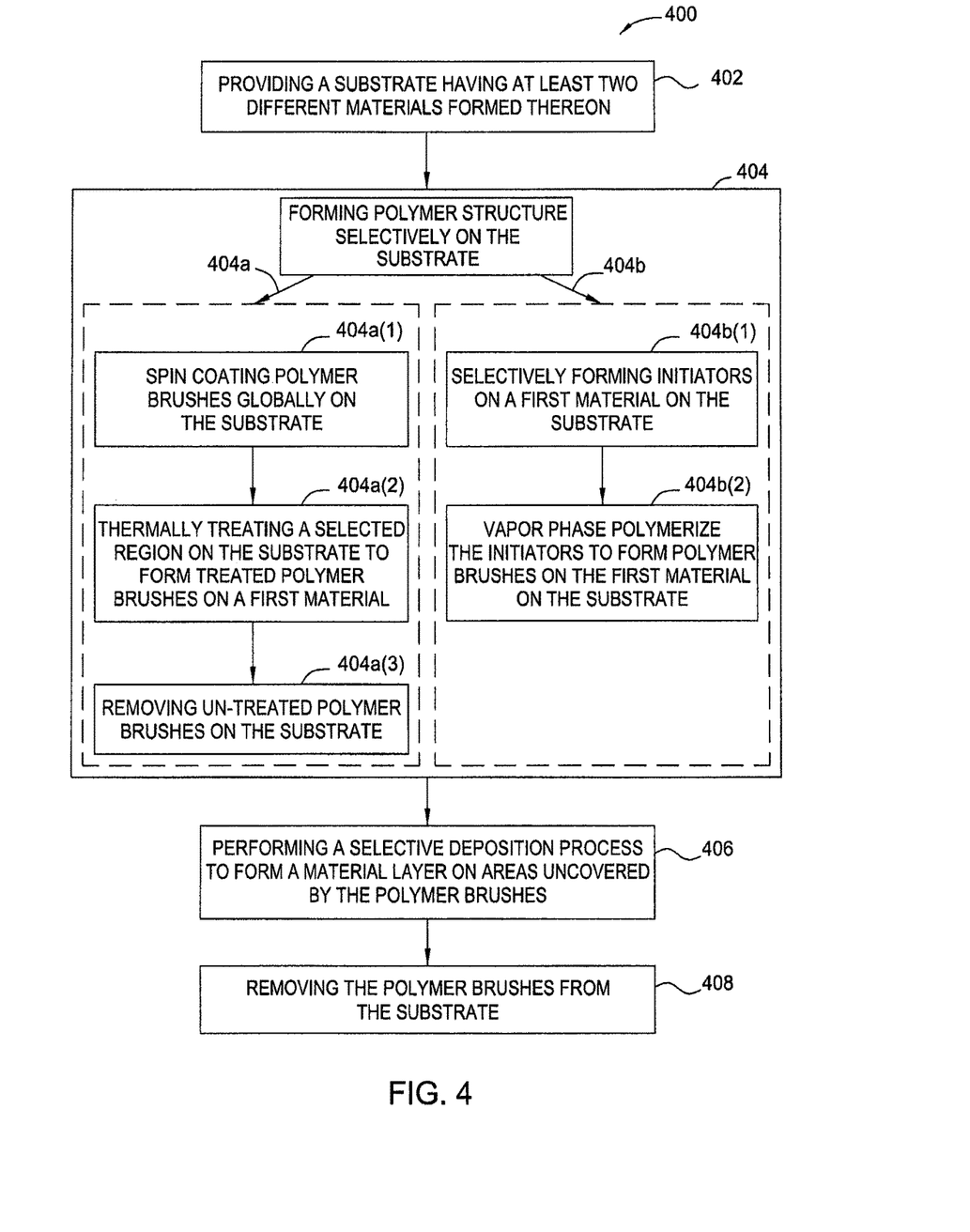
FIG. 4 depicts a flow diagram of an example of a method for selectively forming a material on certain locations on a substrate.

FIG. 4 is a flow diagram of one example of a selective deposition process 400 that may be performed to form different materials on different locations of a structure formed on a, substrate. The structure may be any suitable structures formed on a semiconductor substrate, such as interconnection structure with conductive and non-conductive areas, a fin structure, a gate structure, a contact structure, a front-end structure, a back-end structure or any other suitable structures utilized in semiconductor applications. FIGS. 5A-5F are schematic cross-sectional views of a portion of a composite substrate 101 corresponding to various stages of the process 400. The process 400 may be utilized to a back-end interconnection structure both conductive and non-conductive areas formed on a substrate so as to form desired materials formed on different locations of the back-end interconnection structure. Alternatively, the process 400 may be beneficially utilized to selectively form different materials on different locations of a substrate having more than one material.

Figure 5A:
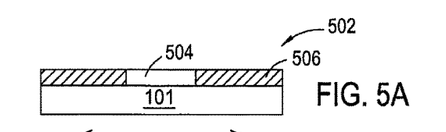
FIGS. 5A-5F depict one embodiment of a sequence for forming a material selectively on certain locations on the substrate during the manufacturing process according to the process depicted in FIG. 4.
Figure 5B:
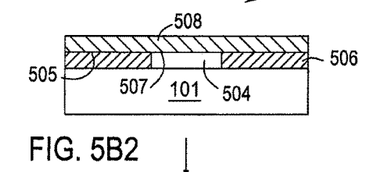
Figure 5B:
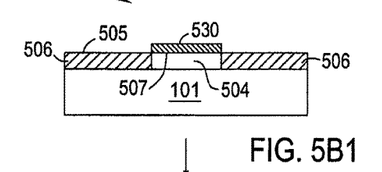
Figure 5C:
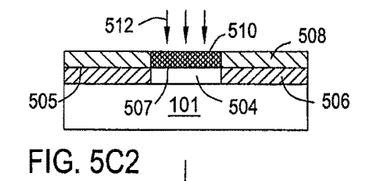
Figure 5C:
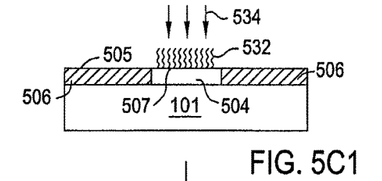

The process 400 begins at operation 402 by providing a substrate, such as the substrate 101 depicted in FIGS. 1-2, as shown in FIG. 5A. In one embodiment, the substrate 101 may have an interconnection structure 502 formed on the substrate 101. In one example, the interconnection structure 502 may be utilized in a back-end structure for forming semiconductor devices. In the example depicted in FIG. 5A, the interconnection structure 502 may include a metal material 504 formed in an insulating material 506. It is noted that the structure 502 may be any structures, including front-end structures or gate structures utilized for forming semiconductor devices.

In one example, the substrate 101 may include materials selected from a group consisting of crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, sapphire. The substrate 101 may have various dimensions, such as 200 mm, 300 mm, 450 mm or other diameter, as well as, being a rectangular or square panel. Unless otherwise noted, embodiments and examples described herein are conducted on substrates with a 200 mm diameter, a 300 mm diameter, or a 450 mm diameter substrate. In the embodiment wherein a SOI structure is utilized for the substrate 101, the substrate 101 may include a buried dielectric layer disposed on a silicon crystalline substrate. In the embodiment depicted herein, the substrate 101 may be a crystalline silicon substrate. Moreover, the substrate 101 is not limited to any particular size or shape. The substrate 110 may be a round substrate having a 200 mm diameter, a 300 mm diameter or other diameters, such as 450 mm, among others. The substrate 101 may also be any polygonal, square, rectangular, curved or otherwise non-circular workpiece, such as a polygonal glass substrate used in the fabrication of flat panel displays.

Although the example depicted in FIG. 5A shown that the interconnection structure 502 is formed on the substrate 101, it is noted that there may be further structures formed between the interconnection structure 502 and the substrate 101 as needed. In one example, a front-end structure, such as a gate structure and/or a contact structure may be formed between the interconnection structure 502 and the substrate 101 to enable functions of the semiconductor devices.

In one example, the insulting material 506 included in the interconnection structure 502 may be a dielectric material, such as silicon oxide material, silicon containing materials, doped silicon materials, low-k material, such as carbon containing materials. Suitable carbon containing materials include amorphous carbon, SiC, SiOC, doped carbon materials or any suitable materials. Suitable examples of the low-k insulating dielectric material includes SiO containing materials, SiN containing materials, SiOC containing materials, SiC containing materials, carbon based materials, or other suitable materials.

The insulating material may be formed by a plasma enhanced chemical vapor deposition (CVD), a flowable chemical vapor deposition (CVD), a high density plasma (HDP) chemical vapor deposition (CVD) process, atomic layer deposition (ALD), cyclical layer deposition (CLD), physical vapor deposition (PVD), or the like as needed.

The metal material 504 formed in the insulating material 506 is exposed ready to receive another materials formed thereon. Similarly, the insulating material 506 is also exposed to receive a second type of material for process integration when needed. Suitable examples of the materials for the metal material 504 include tungsten (W), tantalum (Ta), titanium (Ti), copper (Cu), ruthenium (Ru), nickel (Ni), cobalt (Co), chromium (Cr), iron (Fe), manganese (Mn), aluminum (Al), hafnium (Hf), vanadium (V), molybdenum (Mo), palladium (Pd), gold (Au), silver (Au), platinum (Pt), alloys thereof, and combinations thereof, among others.

At operation 404, a polymer brush structure deposition process is performed to form polymer structures on the substrate 101. Two options, sub-operation 404a and 404b, are described here for different approaches to form polymer brush structures selectively on certain locations of the substrate 101.

Referring first to sub-operation 404a, a first sub-operation process 404a(1) is performed to form a polymer brush material 508 on the substrate 101. The polymer brush material 508 may be an organic material spin-on-coated onto the substrate 101. The polymer brush material 508 may be spin-on-coated onto the substrate 101 globally without selectivity. In one embodiment, the organic material suitable for forming the polymer brush material 508 includes a hydrocarbon containing material. In one example, the polymer brush material 508 is an OH (hydroxy) terminated hydrocarbon containing material with or without benzene rings, silyl functionalized hydrocarbon containing materials with or without benzene rings, multi-OH groups or multi-silyl groups hydrocarbon containing material or the like. Suitable examples of the OH terminated hydrocarbon containing material or silyl functionalized polymers include polystyrene, polyacrylic acid (PAAC), Polydimethylsiloxane (PDMS), polymethyl methacrylate (PMMA), poly(N-isopropylacrylamide), and the like.

In one example, the polymer brush material 508 has head groups as [X—$(CH_2)_n$—OH], which X are any suitable compounds, which are formed on metal, metal oxide or metal dielectric surface, such as Ag, Au, Cu or Al, or [X—$(CH_2)_n$—Si—$H_m$)], [X—$(CH_2$-n-$SiCl_3)$], [X—$(CH_2)_n$—OH], [X—$(CH_2)_n$—Si—OH] or [X—$(CH_2$-n-$SiCl_3)$ formed on dielectric surfaces, such as $SiO_2$, $Al_2O_3$, TiO, TaO, Si, or other oxides.

In one embodiment, the polymer brush material 508 may be coated onto the substrate 101 with a thickness between about 2 nm and about 100 nm, such as between about 3 nm and about 10 nm, for example about 5 nm. In some instances, the thickness of the polymer brush material 508 may be turned to have a relatively higher thickness so as to serve as a blocking layer to enhance the performance of the selective deposition process subsequently performed so that the desired material may be formed at a confined and desired location on the substrate, rather than globally across the substrate surface.

In one example, the polymer brush material 508 may be spin-coated onto the substrate surface. In another embodiment, the polymer brush material 508 may also be coated onto the substrate using injection, spray deposition system, spray deposition system, chemical vapor deposition system (including spray CVD or plasma CVD) as depicted in FIG. 2, aerosol deposition (AD) process, aerojet, nanoparticles spray from solution, ink-jet, meniscus coating, dip coating, electroplating, spray coating, electrospraying, screen printing, or by other suitable techniques as needed.

It is believed that the OH (hydroxy) or silyl terminated group from the hydrocarbon containing material may serve as attaching tips that may attach to the substrate to enable a deposition process. Such process may also be referred as a "grafting-to" process to help provide an attachment mechanism to enable a selective deposition process.

At second sub-operation process 404a(2), a thermal process is performed to selectively thermally process the polymer brush material 508 at certain region of the polymer brush material 508. The thermal process may be a annealing, baking or curing process with a relatively low thermal treatment temperature, such as less than 600 degrees Celsius. Certain regions of the polymer brush material 508 is selectively cured and/or thermally processed to form treated polymer structures 510, as shown in FIG. 5C2. In one example, the regions selected to be thermally treated in on a top surface 507 of the metal material 504, while leaving the polymer brush material 508 on a top surface 505 of the insulating material 506 remained unchanged (e.g., non-thermally treated). The thermal treatment process enhances attachment from the polymer brush material 508 to the substrate so as to form a treated polymer brush material 510 bound to the surface, as shown in FIG. 5C2. As the polymer brush material 508 is selectively thermally treated, a chemical reaction between the functional groups from the polymer brush material 508 and the surface is activated, forming the treated polymer structures 510. The thermal treatment process treats the polymer brush material 508 to activate the covalent bonding to the surface selectively, so as to form treated polymer structures 510 on the top surface 507 of the metal material 504.

In one embodiment, the thermal treating process performed at second sub-operation process 404a(2) may be executed on a hot plate, an oven, a heated chamber or suitable tools that may provide sufficient heat to selectively to certain regions of the polymer brush material 508, such as on the top surface 507 of the metal material 504.

In one embodiment, the thermal treatment temperature may be controlled between about 100 degrees Celsius and 700 degrees Celsius, such as between about 400 degrees Celsius and 600 degrees Celsius. The thermal treatment time may be controlled at between about 1 second and about 1 hour, such as about less than 5 minutes.

It is believed that during the thermal treatment process, the terminated hydroxy (OH) or silyl group from the polymer brush material 508 may be activated to react with the oxygen or hydrogen sources from the substrate surface to enable a successful compound attachment process. As a result, the polymer brushes may be attached and adhered to the substrate surface with good interface control.

Figure 6:
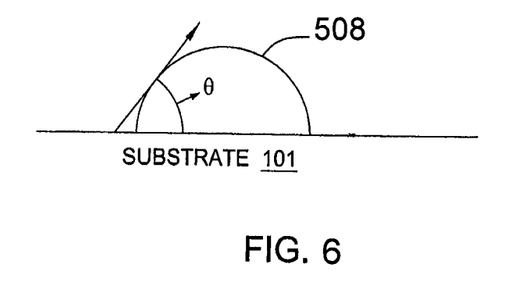
FIG. 6 depicts a cross sectional view of substrate surface having certain wetting angle in contact with a liquid s according to one embodiment of the invention.

It is believed that the hydroxyl or the silyl groups from the treated polymer brush material 510 may efficiently alter the surface wetting performance while attaching to the substrate surface, thus efficiently providing a surface with different wetting ability to enable attachment of the treated polymer brush material 510 to the substrate surface. It is believed that the length and/or numbers of the hydrocarbon chains and certain functional groups from the polymer brush material 508 can provide the wetting angle at a certain desired range when reacting with the substrate surface. In one example, the hydroxyl-terminated polymer brush material 508 with longer hydrocarbon chains has a hydrophobic surface property. The polymer brush material 508 having a relatively high hydrocarbon chain has a wetting angle greater than 60 degrees when disposed on a silicon surface. In the example depicted in FIG. 6, the hydroxyl-terminated polymer brush material has a high wetting angle, e, (e.g., a hydrophobic surface) to the substrate surface. The hydrophobic surface property results in the hydroxyl-terminated polymer brush material accumulating and aggregating on the substrate surface, rather than absorbing or wide spreading to the other regions of the substrate. By doing so, the treated polymer brush material 510 as formed on the substrate 101 may be confined and specifically disposed on certain desired location on the substrate. For example, the hydrophobic surface property from the treated polymer brush material 510 may assist the treated polymer brush material 510 to be confined and formed on the surface 507 of the metal structure 504 without forming on the surface 505 of the insulating material, as shown in FIG. 5C$_2$, thus providing a selective deposition to selectively form the polymer brush material 508 only on the desired locations of the substrate. In one example, the number of the hydrocarbon chains from the polymer brush material 508 may be greater than 10.

Figure 5D:
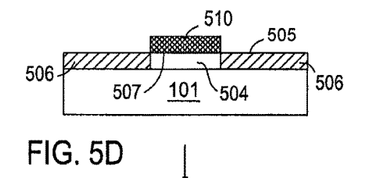
Figure 5E:
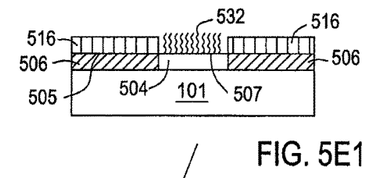
Figure 5E:
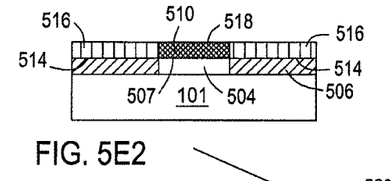

At third sub-operation process 404a(3), after the polymer brush material 508 has been thermally treated, forming the treated polymer brush material 510 selectively on the top surface 507 of the metal material 504, a removal process is then performed. The removal process at third sub-operation process 404a(3) selectively removes the non-thermally treated polymer brush material 508 remained on the top surface 505 of the insulating material 506, as shown in FIG. 5D. The removal process may be a wet process utilizing liquid solution or a dry process utilizing plasma.

In one example, the removal process is a wet process performed by immersing, or soaking the substrate 101 with or in a polymer brush removal solution. In another example, a dry process, such as a vapor or a plasma process, is utilized to react with the surfaces 514 of the polymer brush material 508 without undergoing the thermal treatment process. The wet process performed by dipping, immersing, or soaking the substrate with or in the polymer brush removal solution in a wet tank. The polymer brush removal solution may be an alcohol, alkaline, neutral or acid solution with a pH value in a predetermined range. Selection of the polymer brush removal solution is based on the material types of the polymer brush material 508 remained on the substrate 101. In another specific example, the removal process may be a dry process performed by positioning the substrate in a processing chamber and treating the surface of the substrate using a plasma. The plasma is formed by a removal gas mixture. In one example, the removal gas mixture includes at least one halogen containing gas, an oxygen containing gas. Suitable examples of the halogen containing gas include HBr, $CF_4$, $CHF_3$, HCl, $Cl_2$, $CH_2F_2$, $Cl_2F_6$, $C_2F_8$, $C_4F_6$, $SF_6$, $NF_3$, $O_2$, $CO_2$, CO and the like.

In another option at sub-operation 404b, a first sub-operation process 404b(1) is performed to form an initiator 530 selectively on the top surface 507 of the metal material 504 on the substrate 101, as shown in FIG. 5B1. The initiator 530 is an organic material having material properties that may also be selectively formed on certain locations of the substrate 101, (also referred as a "grafting-from" process), to active the desired locations on the substrate 101. For example, the initiator 530 may be organic monomers disposed on the top surface 507 of the metal material 504 to enable a surface-induced polymerization (SIP) process subsequently performed that may assist forming a target material on the substrate 101 selectively on the desired locations thereon.

In one example, the initiator 530 has head groups as [X—$(CH_2)_n$—OH], which X are any suitable compounds, which are formed on metal, metal oxide, or metal dielectric surface, such as Ag, Au, Cu or Al, or [X—$(CH_2$-n-$SiCl_3$) or [X—$(CH_2$-n-Si—O—$Cl_3$) formed on dielectric surfaces, such as $SiO_2$, $Al_2O_3$, TiO, TaO, Si, or other oxides.

At second sub-operation process 404b(2), a vapor phase polymerization process is performed. The vapor phase polymerization process converts the initiator 530 from monomers into polymer brush structures 532, as shown in FIG. 5C₁. As the initiator 530 is selectively formed on the surface 507 of the metal material 504, the vapor phase polymerization process as performed reacts with the initiator 530 on the substrate 101 without reacting with the insulating material 506 from the substrate 101, thus selectively forming the polymer brush structures 532 on the surface 507 of the metal material 504.

In one embodiment, the vapor phase polymerization process is a vapor process performed with or without plasma. The vapor phase polymerization process is performed at a temperature less than 250 degrees Celsius, such as less than 150 degree Celsius, for example about 120 degrees Celsius. The vapor phase polymerization process actives the initiator 530 to induce polymerization of the initiator 530, forming the polymerized polymer brush structures 532 on the substrate 101.

In one example, the vapor phase polymerization process may be performed in a chemical vapor deposition chamber, such as the processing chamber depicted in FIG. 2. The vapor phase polymerization process may also be performed in any tight-sealing custom made enclosures or containers. The vapor phase polymerization process is performed by exposing the substrate 101 to monomers, such as styrenes, acrylic acids, N-isopropylacrylamide, or the like, to the substrate surface during the process. The vapor phase polymerization process helps the initiator 530 forming a linked compound polymer brush structures 532, providing the polymer brush structures 532 with relatively high grafting density that provides a surface property different from other regions (e.g., the top surface 505 of the insulating layer 506). Thus, by providing the polymer brush structures 532 with the desired surface properties different from the surface properties from other regions (e.g., the top surface 505 of the insulating layer 506), a selective deposition process is then be enabled to form a target material selectively on a predetermined location.

As discussed above, the selected surface property of the initiator 530 or the polymer brush structures 532 may assist forming the initiator 530 and/or the polymer brush structures 532 selectively on certain regions of the substrate. Thus, a selective deposition process performed subsequent to that would be enabled to selectively form a target material on certain regions or exclusively on certain regions of the substrate. Similarly, the initiator 530 and/or the polymer brush structures 532 may have a surface wetting angle greater than 60 degrees when disposed on a silicon surface. The initiator 530 and/or the polymer brush structures 532 may have a hydrogen carbon chain at least greater than 3.

At operation 406, after the treated polymer structures 510 and the polymer brush material 532 are formed on the metal structure 504, as shown in FIGS. 5D and 5C1 respectively and the top surface 505 of the insulating layer 506 is exposed, a selectively deposition process is then performed to form a material layer 516, as shown in FIGS. 5E2 and 5E1 respectively. The selective deposition process performed is performed to predominantly form the material layer 516 with compatible film qualities and characteristics to materials from the insulating layer 506, but not to the treated polymer structures 510 and/or the polymer brush material 532 formed on the metal material 504. As a result, the material layer 516 is selectively formed on the insulating layer 506, rather than on the treated polymer structures 510 and/or the polymer brush material 532 or globally formed across the substrate 101, including the surfaces 505 of the insulating material 506.

In the embodiments wherein the material layer 516 is selected to form on the insulating layer 506, the material layer 516 is a dielectric material. Suitable examples of the dielectric material for the material layer 516 include metal dielectric materials or insulating dielectric materials, such as AlN, $WSiO_2$, WSi, $SiO_2$, SiON, SiN, SiOC, SiC, $Al_2O_3$, AlON, amorphous carbon, carbon containing material or low-k dielectric materials, TiN, TaN, TiON, TaON, hafnium containing oxide ($HfO_x$), zirconium oxide ($ZrO_x$), titanium oxide ($TiO_x$), tantalum oxide ($TaO_x$), niobium oxide ($NbO_x$), iron oxide ($FeO_x$), yttrium oxide ($YO_x$), aluminum oxide ($AlO_x$) and the like.

In one example, the selective deposition process may be an ALD process, CVD process, or any suitable deposition process. In one example depicted herein, the selective deposition process is an atomic layer deposition process utilizing the processing chamber 100 depicted in FIG. 1, or a CVD process utilizing the processing chamber 200 depicted in FIG. 2.

In the example wherein the selective deposition process is an ALD process, an atomic layer deposition (ALD) process is a chemical vapor deposition (CVD) process with self-terminating/limiting growth. The ALD process yields a thickness of only a few angstroms or in a monolayer level. The ALD process is controlled by distribution of a chemical reaction into two separate half reactions which are repeated in cycles. The thickness of the material layer 516 formed by the ALD process depends on the number of the reaction cycles.

The first reaction provides a first atomic layer of molecular layer being absorbed on the substrate and the second reaction provide a second atomic layer of molecular layer being absorbed on the first atomic layer. As the ALD process is very sensitive to the substrate conditions, the material layer 516 that forms on the insulating material 506 may not be able to adhere or form on the treated polymer structures 510 and/or the polymer brush material 532 due to the film material property difference. Thus, by utilizing the differences of the material properties at different locations from the substrate, a selective ALD deposition process may be enabled that allows the precursors from the ALD deposition process to nucleate and grow on the nucleate sites provided from the insulating material 506, while inert to the surfaces from the treated polymer structures 510 and/or the polymer brush material 532.

Though the examples depicted in FIG. 5A-5F shown that the treated polymer structures 510 and/or the polymer brush material 532 is formed on the surface 507 of the metal material 504, it is noted that the materials of the treated polymer structures 510 and/or the polymer brush material 532 may be selected to be formed on the surface 505 of the insulating layer 506 that allows the material layer 516 to be selectively formed on the metal material 504 as needed, or vice versa. In the example of FIGS. 5E₂ and 5E₁, as the material layer 516 is selected to be formed on the surface 505 of the insulating material 506, the material of the material layer 516 is then selected to be easily absorbed and attached to the insulating materials provided from the insulating material 506 from the substrate 101. Thus, the selective ALD deposition process only grow the insulating layer 506 on designated sites only without forming on the conductive material from the metal structure 504.

During the ALD deposition process, a pulse of a first reactant gas mixture is supplied into the processing chamber, such as the processing chamber 100 depicted in FIG. 1, to form a first monolayer the material layer 516. It is believed that the first monolayer is absorbed onto the insulating material 506 (or reversely on the metal material 504) by a chemical reaction that allows the atoms from the first monolayer to be securely adhered on the atoms from the insulating material 506. Since the conductive material from the metal material 504 may have chemical properties different from the non-conductive material from the insulating material 506, the molecules from the metal material 504 may not be able to successfully adhere the atoms from the first monolayer of the material layer 516, thus only allowing the atoms from the first monolayer to be adhered on the atoms of the insulating layer 506. In this way, the subsequently formed second monolayer only selectively deposits on the first monolayer, thus enabling a selective deposition of an ALD process.

In the example wherein the material layer 516 is formed on the insulating layer 506, the material layer 516 is a $SiO_2$, SiN, SiON, SiOC, SiC, Si containing material, amorphous carbon, hafnium containing oxide ($HfO_x$), zirconium oxide ($ZrO_x$), titanium oxide ($TiO_x$), tantalum oxide ($TaO_x$), niobium oxide ($NbO_x$), iron oxide ($FeO_x$), yttrium oxide ($YO_x$), aluminum oxide ($AlO_x$), and the like. In another example wherein the material layer 516 is formed on the metal material 504, the material layer 516 may be metal containing materials, such as Ni, Ru, TaN, TiN, Pt, Ir, Cu, Al, W, alloys thereof or any suitable materials as needed.

Figure 5F:
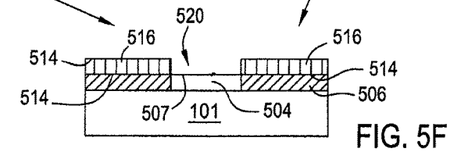

At operation 408, after the material layer 516 is formed on the substrate 101, the treated polymer structures 510 and/or the polymer brush material 532 may then be removed from the substrate 101, as shown in FIG. 5F, leaving the material layer 516 on the surface 505 of the insulating layer 516. In one example, the treated polymer structures 510 and/or the polymer brush material 532 may be removed by any etching, ashing or striping processes that utilize an oxygen containing gas and/or hydrogen containing gas to remove the treated polymer structures 510 and/or the polymer brush material 532 from the substrate 101. The oxygen containing gas and/or hydrogen containing gas may efficiently form oxidizer (O.), reducer (H.), and hydroxyl groups (OH). It is believed that oxygen oxidizer can react with the carbon element from the treated polymer structures 510 and/or the polymer brush material 532 to form a volatile compound (e.g., $CO_2$) which may be exhausted from the chamber. It is noted that the polymer brush material 532 may be removed in a plasma processing chamber, such as the processing chamber 200 depicted in FIG. 2, or any other suitable processing chambers.

Thus, a selective deposition process is provided to form different materials on different surfaces, e.g., different portions of a structure formed on a substrate by utilizing polymer brush structures selectively formed on the substrate. The method utilizes polymer brush structures to enable a selective ALD process to form a target layer on certain locations of a structure of a substrate with different materials on different surfaces of the structure. Thus, a structure with desired different type of materials formed on different locations in the structure may be obtained.

While the foregoing is directed to embodiments of the present disclosure, other and further embodiments of the disclosure may be devised without departing from the basic scope thereof, and the scope thereof is determined by the claims that follow.

The invention claimed is:

1. A method of forming a structure with desired materials on a substrate comprising:

disposing organic materials on a surface of a substrate;

performing a thermal treatment process having a process temperature between about 400 degrees Celsius and about 600 degrees Celsius to form polymer brush materials from the organic materials selective on a first region of the substrate; and selectively forming a material layer on a second region of the substrate uncovered by the polymer brush materials.

2. The method of claim 1, wherein the organic materials are organic monomers or organic polymers.

3. The method of claim 1, wherein the polymer brush materials comprise OH (hydroxy) terminated hydrocarbon containing material or silyl functionalized hydrocarbon containing materials with or without benzene rings.

4. The method of claim 1, wherein the polymer brush is selected from a group consisting of polystyrene, polyacrylic acid (PAAC), Polydimethylsiloxane (PDMS), polymethyl methacrylate (PMMA) and poly(N-isopropylacrylamide).

5. The method of claim 1, wherein the thermal treatment process provides thermal energy selectively to the organic material disposed on the first region of the substrate.

6. The method of claim 5, wherein the organic material is activated to form the polymer brush materials selectively on the first region of the substrate, leaving the organic material on the second region of the substrate unchanged.

7. The method of claim 1, wherein the organic material has a hydrophobic surface property when disposed on a silicon containing surface.

8. The method of claim 7, wherein the organic material has a wetting angle greater than 60 degrees when disposed on a silicon containing surface.

9. The method of claim 1, wherein the material layer is a metal containing material when the second region of the substrate is a metal containing material.

10. The method of claim 1, wherein the material layer is a dielectric material when the second region of the substrate is a dielectric material.

11. The method of claim 1, wherein the vapor polymerization process congregates monomers from the organic material into polymer compounds.

12. The method of claim 1, wherein selectively forming the material layer by an atomic layer deposition process.

13. The method of claim 1, wherein polymer brush materials have hydrocarbon chain greater than 10.

14. A method of forming a structure with desired materials on a substrate for semiconductor applications comprising:

spin-coating a polymer material globally on a substrate;

thermal treating the polymer material selectively disposed on a first region of the substrate at a process temperature between about 400 degrees Celsius and about 600 degrees Celsius to form a treated polymer material on the first region of the substrate;

removing the polymer material disposed on a second region of the substrate untreated by the thermal treating process; and selectively forming a material layer on the second region of the substrate uncovered by the treated polymer material.

15. The method of claim 14, wherein the polymer material comprises OH (hydroxy) terminated hydrocarbon containing material or silyl functionalized hydrocarbon containing materials with or without benzene rings.

* * * * *